United States Patent
Huang

(10) Patent No.: US 10,504,395 B2
(45) Date of Patent: Dec. 10, 2019

(54) SHIFT REGISTER UNIT, DRIVING METHOD THEREOF, GATE DRIVING CIRCUIT, AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Fei Huang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 0 days.

(21) Appl. No.: 15/941,169

(22) Filed: Mar. 30, 2018

(65) Prior Publication Data

US 2019/0043400 A1    Feb. 7, 2019

(30) Foreign Application Priority Data

Aug. 2, 2017    (CN) .......................... 2017 1 0653195

(51) Int. Cl.
    *G09G 3/36*     (2006.01)
    *G11C 19/28*     (2006.01)
    *G09G 3/20*     (2006.01)
    *G09G 3/3266*     (2016.01)

(52) U.S. Cl.
    CPC ............ *G09G 3/20* (2013.01); *G09G 3/3266* (2013.01); *G09G 3/3677* (2013.01); *G11C 19/28* (2013.01); *G09G 2300/0408* (2013.01); *G09G 2310/0286* (2013.01); *G09G 2330/021* (2013.01)

(58) Field of Classification Search
CPC ...... G09G 3/20; G09G 3/3266; G09G 3/3674; G09G 3/3677; G09G 2300/0408; G09G 2310/0286; G09G 2310/06; G09G 2310/08; G11C 19/28; G11C 19/287
See application file for complete search history.

(56) References Cited

U.S. PATENT DOCUMENTS

| | | | | |
|---|---|---|---|---|
| 9,293,093 B2* | 3/2016 | Kim | ................. | G09G 3/3611 |
| 9,886,921 B2* | 2/2018 | Chen | ................. | G09G 3/3611 |
| 10,236,073 B2* | 3/2019 | Feng | ................. | G09G 3/3677 |
| 10,283,038 B2* | 5/2019 | Zhou | ................. | G09G 3/20 |

(Continued)

FOREIGN PATENT DOCUMENTS

| | | |
|---|---|---|
| CN | 105047228 A | 11/2015 |
| CN | 105096889 A | 11/2015 |
| CN | 106169280 A | 11/2016 |

OTHER PUBLICATIONS

First Office Action for Chinese Patent Application No. 201710653195.3 dated Aug. 26, 2019.

*Primary Examiner* — Patrick O Neill
(74) *Attorney, Agent, or Firm* — Calfee, Halter & Griswold LLP

(57) ABSTRACT

A shift register unit includes an input circuit configured to output a pre-output signal in response to an input signal and a first clock signal, a first output circuit configured to output a first output signal in response to the pre-output signal and a second clock signal; and a second output circuit configured to output a second output signal in response to the pre-output signal and a third clock signal.

17 Claims, 7 Drawing Sheets

(56) References Cited

U.S. PATENT DOCUMENTS

2009/0010379 A1 1/2009 Chiang et al.
2011/0069044 A1 3/2011 Lee et al.
2016/0358666 A1* 12/2016 Pang .................... G11C 19/287
2017/0358267 A1 12/2017 Feng et al.

* cited by examiner

SHIFT REGISTER UNIT, DRIVING METHOD THEREOF, GATE DRIVING CIRCUIT, AND DISPLAY DEVICE

CROSS REFERENCE TO RELATED APPLICATIONS

This application claims the benefit of Chinese Patent Application No. 201710653195.3 filed on Aug. 2, 2017, the entire disclosure of which is incorporated herein by reference.

TECHNICAL FIELD

The present disclosure relates to the field of display technology, and in particular to a shift register unit, a driving method thereof, a gate driving circuit, and a display device.

BACKGROUND

Gate Driver On Array (GOA) is a technology that integrates a gate driving circuit on an array substrate to replace a separate gate driving chip to reduce power consumption and cost. The GOA-based gate driving circuit is essentially a shift register that outputs gate drive signals to the gate lines in synchronization with a clock signal, thereby turning on a corresponding pixel transistor.

In the prior art, each of the gate lines is usually provided with a corresponding GOA unit to drive the pixels connected to the gate line, which means that the number of required GOA units is equal to the number of the rows of pixels in the display panel. As the resolution of the display panel increases, more GOA units will be needed, thus occupying a larger circuit area and generating greater power consumption.

SUMMARY

It would be advantageous to provide a solution that may alleviate, mitigate or eliminate one or more of the above problems.

According to an aspect of the present disclosure, a shift register unit is provided comprising: an input terminal for receiving an input signal; a first clock terminal for receiving a first clock signal; a second clock terminal for receiving a second clock signal; a third clock terminal for receiving a third clock signal; a pre-output terminal for outputting a pre-output signal; a first output terminal for outputting a first output signal; a second output terminal for outputting a second output signal; an input circuit configured to output the pre-output signal via the pre-output terminal in response to the input signal and the first clock signal; a first output circuit, connected to the input circuit, configured to output the first output signal via the first output terminal in response to the pre-output signal and the second clock signal; and a second output circuit, coupled to the input circuit, configured to output the second output signal via the second output terminal in response to the pre-output signal and the third clock signal.

In some embodiments, the first output circuit comprises: a first transistor of a first channel type having a control electrode connected to the second clock terminal, a first electrode connected to the pre-output terminal, and a second electrode connected to the first output terminal; and a first transistor of a second channel type having a control electrode connected to the second clock terminal, a first electrode configured to receive a first power supply voltage, and a second electrode connected to the first output terminal.

In some embodiments, the second output circuit comprises: a second transistor of the first channel type having a control electrode connected to the third clock terminal, a first electrode connected to the second output terminal, and a second electrode connected to the pre-output terminal; and a second transistor of the second channel type having a control electrode connected to the third clock terminal, a first electrode connected to the second output terminal, and a second electrode configured to receive a first power supply voltage.

In some embodiments, the shift register unit further comprises: a third inverter connected between the pre-output terminal and the first and second output circuits; a first inverter connected between the first output circuit and the first output terminal; and a second inverter connected between the second output circuit and the second output terminal.

In some embodiments, the input circuit comprises: an input sub-circuit, connected to the input terminal, configured to output a first control signal and a second control signal in response to the input signal; a first control circuit, connected to the input sub-circuit, configured to output a third control signal in response to the first control signal; a second control circuit, connected to the input sub-circuit and the first clock terminal, configured to output a fourth control signal in response to the second control signal; a third control circuit, connected to the first control circuit and the second control circuit, configured to output a fifth control signal in response to the third control signal and the fourth control signal; and a pre-output circuit, coupled to the third control circuit, configured to output the pre-output signal in response to the fifth control signal.

In some embodiments, the input sub-circuit comprises: a third transistor of the first channel type having a control electrode connected to the input terminal, a first electrode connected to the first control circuit, and a second electrode configured to receive a second power supply voltage; a third transistor of the second channel type having a control electrode connected to the input terminal, a first electrode connected to the first electrode of the third transistor of the first channel type, and a second electrode connected to the third control circuit; and a fourth transistor of the first channel type having a control electrode connected to the input terminal, a first electrode connected to the input terminal, and a second electrode connected to the second control circuit.

In some embodiments, the first control circuit comprises: a fifth transistor of the first channel type having a control electrode connected to the first electrode of the third transistor of the first channel type, a first electrode connected to the second electrode the fourth transistor of the first channel type, and a second electrode connected to the third control circuit; and a sixth transistor of the first channel type having a control electrode connected to the first electrode of the third transistor of the first channel type, a first electrode connected to the second electrode of the fifth transistor of the first channel, and a second electrode configured to receive the second power supply voltage.

In some embodiments, the second control circuit comprises: a fourth transistor of the second channel type having a control electrode connected to the second electrode of the fourth transistor of the first channel type, a first electrode connected to the third control circuit, and a second electrode connected to the second electrode of the fifth transistor of the first channel type; and a seventh transistor of the first channel type having a control electrode connected to the second electrode of the fourth transistor of the first channel type, a first electrode connected to the first electrode of the fourth transistor of the second channel type, and a second electrode connected to the first clock terminal.

In some embodiments, the third control circuit comprises: a fifth transistor of the second channel type having a control electrode connected to the second electrode of the fifth transistor of the first channel type, a first electrode connected to the second electrode of the third transistor of the second channel type, and a second electrode configured to receive a first power supply voltage; and an eighth transistor of the first channel type having a control electrode connected to the second electrode of the fifth transistor of the first channel and the first electrode of the fourth transistor of the second channel type, a first electrode connected to the second electrode of the third transistor of the second channel type, and a second electrode configured to receive the second power supply voltage.

In some embodiments, the pre-output circuit comprises: a sixth transistor of the second channel type having a control electrode connected to the first electrode of the fifth transistor of the second channel type and the first electrode of the eighth transistor of the first channel, a first electrode connected to the pre-output terminal, and a second electrode configured to receive the first power supply voltage; and a ninth transistor of the first channel type having a control electrode connected to the first electrode of the fifth transistor of the second channel type, a first electrode connected to the pre-output terminal, and a second electrode configured to receive the second power supply voltage.

In some embodiments, the input circuit further comprises a fourth control circuit connected to the input sub-circuit, the first control circuit and the second control circuit and configured to output a sixth control signal in response to the third control signal and the fourth control signal, and the input sub-circuit is further configured to output the first control signal in response to the sixth control signal and the second control signal.

In some embodiments, the fourth control circuit comprises a tenth transistor of the first channel type having a control electrode connected to the second electrode of the fifth transistor of the first channel type and the first electrode of the fourth transistor of the second channel type, a first electrode connected to the input terminal, and a second electrode connected to the control electrode of the tenth transistor of the first channel type.

According to another aspect of the present disclosure, a method of driving the shift register unit as described above is provided, which comprises: supplying a pulse signal to the input terminal as the input signal, the pulse signal having an active interval 1 H defined by a leading edge and a trailing edge; supplying the first clock signal to the first clock terminal, the first clock signal having a period of 2 H and a duty cycle of 50%, the first clock signal comprising leading edges where the first clock signal transitions from inactive to active and trailing edges where the first clock signal transitions from active to inactive, one of the leading edges being delayed by 1/2 H with respect to the leading edge of the input pulse; supplying the second clock signal to the second clock terminal, the second clock signal having a period of 2 H and a duty cycle of 25%, the second clock signal comprising leading edges where the second clock signal transitions from inactive to active and trailing edges where the second clock signal transitions from active to inactive, the leading edges being synchronized with the leading edges of the first clock signal; and supplying the third clock signal to the third clock terminal, the third clock signal being a delayed version of the second clock signal delayed by 1/2 H.

According to yet another aspect of the present disclosure, a gate driving circuit is provided comprising N cascaded shift register units as described above. N is a positive integer and N≥2. The input terminal of an n-th one of the shift register units is connected to the pre-output terminal of an (n−1)-th one of the shift register units, n being a positive integer and 1<n≤N.

In some embodiments, the first clock terminal, the second clock terminal and the third clock terminal of a (2k−1)-th one of the shift register units are configured to respectively receive the first clock signal, the second clock signal and the third clock signal, k being a positive integer and 1<2k≤N. The first clock terminal, the second clock terminal and the third clock terminal of a 2k-th one of the shift register units are configured to respectively receive a fourth clock signal, a fifth clock signal and a sixth clock signal.

In some embodiments, the first clock signal has a period of 2 H and a duty cycle of 50%, the second clock signal has a period of 2 H and a duty cycle of 25%, the third clock signal is a delayed version of the second clock signal delayed by 1/2 H, the fourth clock signal is an inverted version of the first clock signal, the fifth clock signal is a delayed version of the third clock signal delayed by 1/2 H, and the sixth clock signal is a delayed version of the fifth clock signal delayed by 1/2 H.

According to still yet another aspect of the present disclosure, an array substrate is provided comprising the gate driving circuit as described above.

According to a further aspect of the present disclosure, a display device is provided comprising the gate driving circuit as described above.

These and other aspects of the present disclosure will be apparent from and elucidated with reference to the embodiment(s) described hereinafter.

DETAILED DESCRIPTION

It will be understood that, although the terms first, second, third etc. may be used herein to describe various elements, components and/or sections, these elements, components and/or sections should not be limited by these terms. These terms are only used to distinguish one element, component or section from another. Thus, a first element, component or section discussed below could be termed a second element, component or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "connected to", or "coupled to" another element or layer, it can be directly connected or coupled to the other element, or intervening elements may be present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

To make the objectives, technical solutions, and advantages of the present disclosure more apparent, embodiments of the present disclosure will be further described in detail below with reference to the accompanying drawings.

Figure 1:
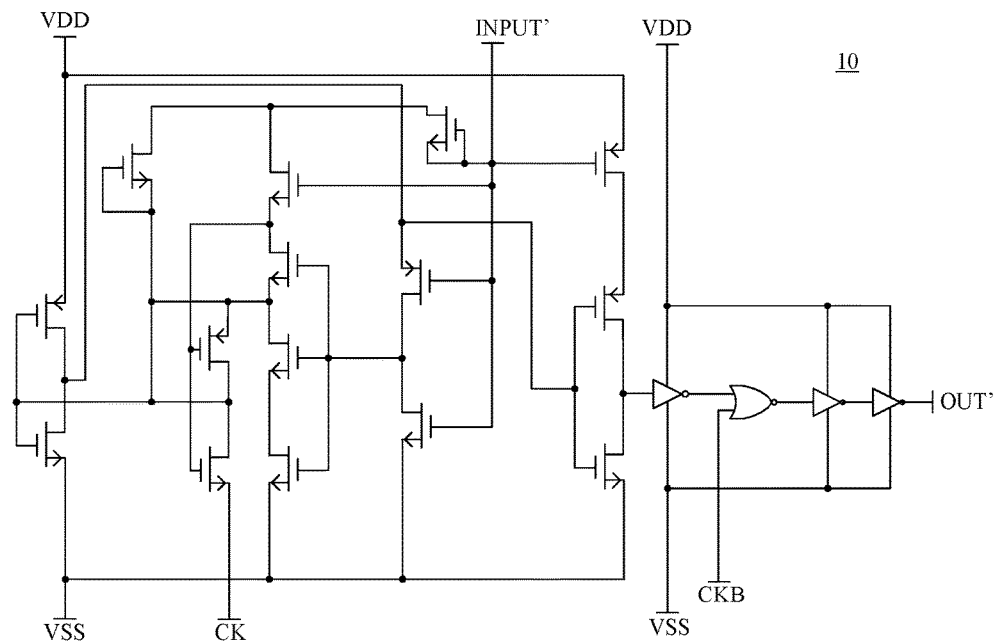
FIG. 1 is a schematic circuit diagram of a shift register unit in the related art.

FIG. 1 shows a schematic circuit diagram of a shift register unit 10 in the related art. The shift register unit 10 is powered by a first power supply voltage VDD (a high level DC voltage) and a second power supply voltage VSS (a low level DC voltage) and receives an input signal INPUT', a first clock signal CK, and a second clock signal CKB.

Figure 2:
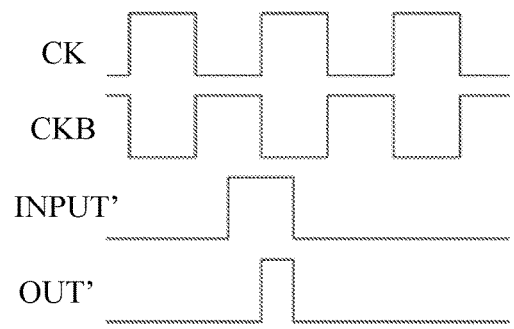
FIG. 2 is a timing diagram of the shift register unit shown in FIG. 1.

FIG. 2 shows a timing diagram of the shift register unit 10. The shift register unit 10 outputs a single output signal OUT' under the control of the input signal INPUT', the first clock signal CK, and the second clock signal CKB. Since the shift register unit 10 can only output one gate driving signal, the resulting gate driving circuit will consume a large circuit area and power.

Figure 3:
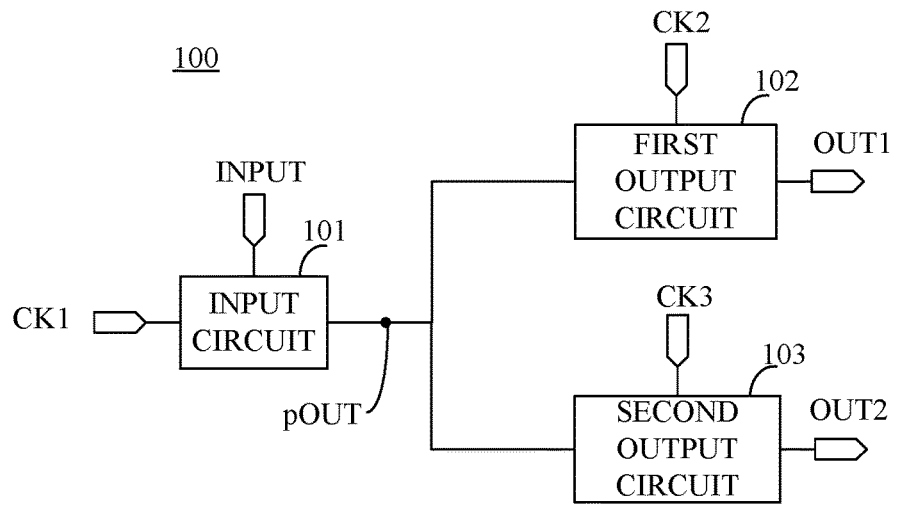
FIG. 3 is a block diagram of a shift register unit according to an embodiment of the present disclosure.

FIG. 3 is a block diagram of a shift register unit 100 according to an embodiment of the present disclosure.

As shown in FIG. 3, the shift register unit 100 includes an input circuit 101, a first output circuit 102, and a second output circuit 103. The shift register unit 100 further comprises an input terminal for receiving an input signal INPUT, a first clock terminal for receiving a first clock signal CK1, a second clock terminal for receiving a second clock signal CK2, a third clock terminal for receiving a third clock signal CK3, a pre-output terminal for outputting a pre-output signal pOUT, a first output terminal for outputting a first output signal OUT1, and a second output terminal for outputting a second output signal OUT2.

The input circuit 101 is configured to output a pre-output signal based on the input signal INPUT and the first clock signal CK1.

The first output circuit 102 is connected to the input circuit 101 for outputting the first output signal OUT1 based on the pre-output signal pOUT and the second clock signal CK2.

The second output circuit 103 is connected to the input circuit 101 for outputting the second output signal OUT2 based on the pre-output signal pOUT and the third clock signal CK3.

The shift register unit 100 can output two gate drive signals OUT1 and OUT2, thus reducing the number of shift register units required in the gate driving circuit. This facilitates reduction of the power consumption of the display panel and the circuit footprint. Also, the cost can be saved due to the reduction in the number of shift register units.

Figure 4:
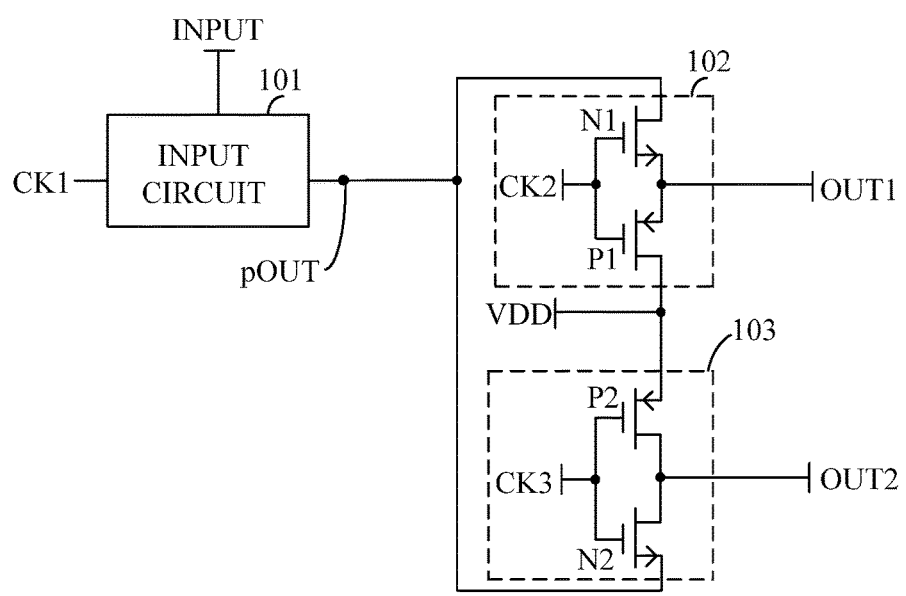
FIG. 4 is an exemplary circuit diagram of the shift register unit shown in FIG. 3.

FIG. 4 is an exemplary circuit diagram of the shift register unit 100 shown in FIG. 3, in which an example configuration of the first output circuit 102 and the second output circuit 103 is shown.

The first output circuit 102 includes a first N-type transistor N1 and a first P-type transistor P1. A control electrode of the first N-type transistor N1 and a control electrode of the first P-type transistor P1 are used to receive the second clock signal CK2. A first electrode of the first N-type transistor N1 is connected to the pre-output terminal that outputs the pre-output signal pOUT. A first electrode of the first P-type transistor P1 is used to receive a first power supply voltage VDD. A second electrode of the first N-type transistor N1 and a second electrode of the first P-type transistor P1 are both connected to the first output terminal.

The second output circuit 103 includes a second N-type transistor N2 and a second P-type transistor P2. A control electrode of the second N-type transistor N2 and a control electrode of the second P-type transistor P2 are used to receive the third clock signal CK3. A second electrode of the second P-type transistor P2 is configured to receive the first power supply voltage VDD. A second electrode of the second N-type transistor N2 is connected to a pre-output terminal that outputs the pre-output signal pOUT. A first electrode of the second N-type transistor N2 and a first electrode of the second P-type transistor P2 are both connected to the second output terminal.

Figure 5:
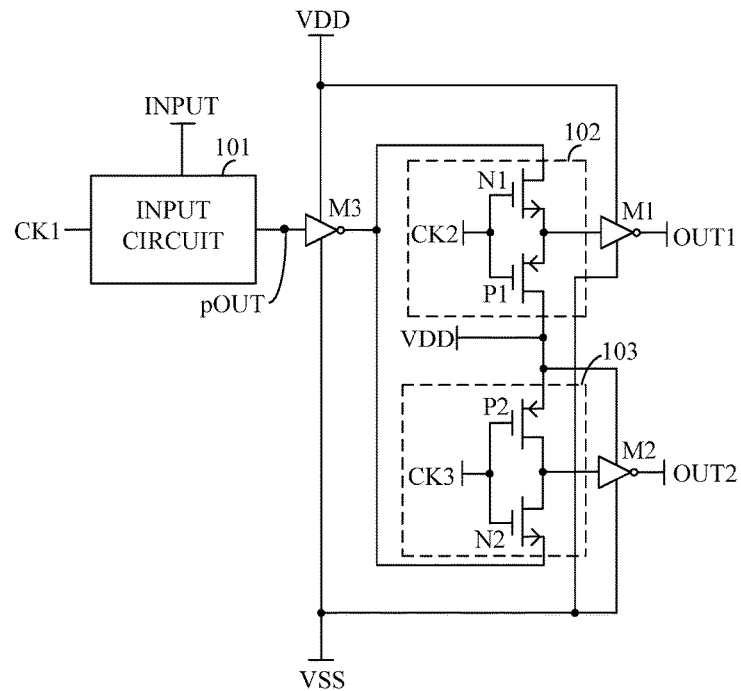
FIG. 5 is an exemplary circuit diagram of the shift register unit shown in FIG. 3.

FIG. 5 shows a variation of the exemplary circuit of FIG. 4, in which the shift register unit 100 further comprises a third inverter M3 connected between the pre-output terminal and the first and second output circuits 102, 103, a first inverter M1 connected between the first output circuit 102 and the first output terminal, and a second inverter M2 connected between the second output circuit 103 and the second output terminal.

The addition of the first, second, and third inverters M1, M2, M3 allows for increased drive capabilities of the output signals OUT1 and OUT2 without affecting the logic of the output signals.

Figure 6:
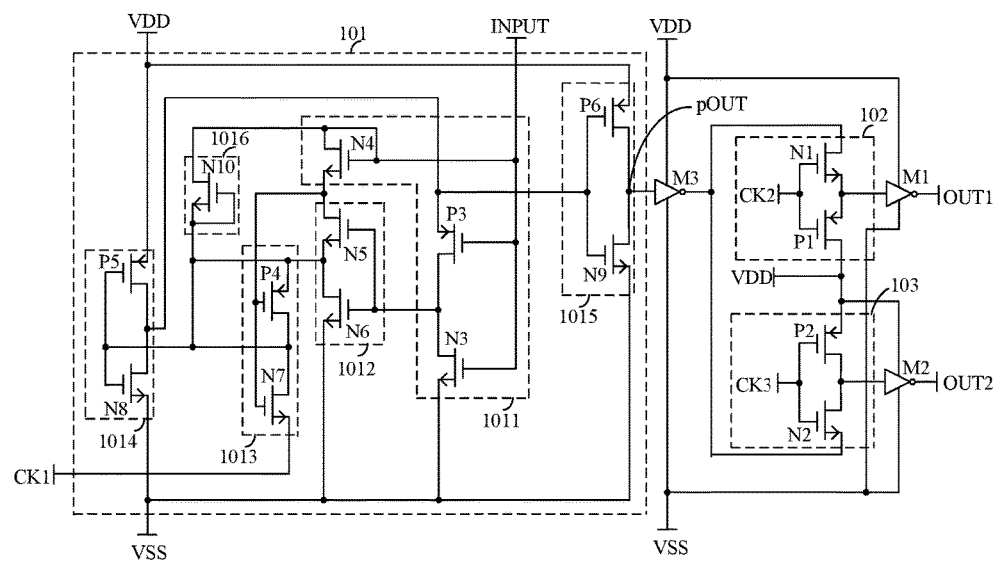
FIG. 6 is an exemplary circuit diagram of the shift register unit shown in FIG. 3.

FIG. 6 is an exemplary circuit diagram of the shift register unit 100 shown in FIG. 3, in which an example configuration of the input circuit 101 is further shown. The input circuit 101 includes an input sub-circuit 1011, a first control circuit 1012, a second control circuit 1013, a third control circuit 1014, and a pre-output circuit 1015.

The input sub-circuit 1011 is configured to output a first control signal and a second control signal based on the input signal INPUT. In the example of FIG. 6, the input sub-circuit 1011 includes a third N-type transistor N3, a third P-type transistor P3, and a fourth N-type transistor N4. Control electrodes of the third N-type transistor N3 and the third P-type transistor P3 are both connected to the input terminal to receive the input signal INPUT. First electrodes of the third N-type transistor N3 and the third P-type transistor P3 are both connected to the first control circuit 1012. A second electrode of the third P-type transistor P3 is connected to the third control circuit 1014. A second electrode of the third N-type transistor N3 is configured to receive a second power supply voltage VSS. A control electrode and a first electrode of the fourth N-type transistor N4 are both connected to the input terminal to receive the input signal INPUT. A second electrode of the fourth N-type transistor N4 is connected to the second control circuit 1013.

The first control circuit 1012 is connected to the input sub-circuit 1011 and configured to output a third control signal based on the first control signal. In the example of FIG. 6, the first control circuit 1012 includes a fifth N-type transistor N5 and a sixth N-type transistor N6. Control electrodes of the fifth N-type transistor N5 and the sixth N-type transistor N6 are both connected to the input sub-circuit 1011 (specifically, the first electrode of the third N-type transistor N3). A second electrode of the fifth N-type transistor N5 and a first electrode of the sixth N-type transistor N6 are both connected to the third control circuit 1014. A first electrode of the fifth N-type transistor N5 is connected to the second control circuit 1013 and the second electrode of the fourth N-type transistor N4. A second electrode of the sixth N-type transistor N6 is configured to receive the second power supply voltage VSS.

The second control circuit 1013 is connected to the input sub-circuit 1011 and the first clock terminal and is configured to output a fourth control signal based on the second control signal. In the example of FIG. 6, the second control circuit 1013 includes a fourth P-type transistor P4 and a seventh N-type transistor N7. Control electrodes of the fourth P-type transistor P4 and the seventh N-type transistor N7 are both connected to the input sub-circuit 1011 (specifically, the second electrode of the fourth N-type transistor N4). First electrodes of the fourth P-type transistor P4 and the seventh N-type transistor N7 are both connected to the third control circuit 1014. A second electrode of the fourth P-type transistor P4 is connected to the third control circuit 1014 and the second electrode of the fifth N-type transistor N5. A second electrode of the seventh N-type transistor N7 is connected to the first clock terminal to receive the first clock signal CK1.

The third control circuit 1014 is connected to the first control circuit 1012 and the second control circuit 1013 and is configured to output a fifth control signal based on the third control signal and the fourth control signal. In the example of FIG. 6, the third control circuit 1014 includes a fifth P-type transistor P5 and an eighth N-type transistor N8. Control electrodes of the fifth P-type transistor P5 and the eighth N-type transistor N8 are both connected to the first control circuit 1012 and the second control circuit 1013 (specifically, the second electrode of the fifth N-type transistor N5 and the first electrode of the fourth P-type transistor P4). First electrodes of the fifth P-type transistor P5 and the eighth N-type transistor N8 are both connected to the pre-output circuit 1015 and the second electrode of the third P-type transistor P3. A second electrode of the fifth P-type transistor P5 is configured to receive the first power supply voltage VDD. A second electrode of the eighth N-type transistor N8 is configured to receive the second power supply voltage VSS.

The pre-output circuit 1015 is connected to the third control circuit 1014 and configured to output the pre-output signal pOUT based on the fifth control signal. In the example of FIG. 6, the pre-output circuit 1015 includes a sixth P-type transistor P6 and a ninth N-type transistor N9. Control electrodes of the sixth P-type transistor P6 and the ninth N-type transistor N9 are both connected to the third control circuit 1014 (specifically, the first electrode of the fifth P-type transistor P5 and the first electrode of the eighth N-type transistor N8). First electrodes of the sixth P-type transistor P6 and the ninth N-type transistor N9 are both connected to the pre-output terminal. A second electrode of the sixth P-type transistor P6 is configured to receive the first power supply voltage VDD. A second electrode of the ninth N-type transistor N9 is configured to receive the second power supply voltage VSS.

Still referring to FIG. 6, the input circuit 101 further optionally includes a fourth control circuit 1016. The fourth control circuit 1016 is connected with the input sub-circuit 1011, the first control circuit 1012, and the second control circuit 1013 and is configured to output a fifth control signal based on the third control signal and the fourth control signal. In the example of FIG. 6, the fourth control circuit 1016 includes a tenth N-type transistor N10. A control electrode and a second electrode of the tenth N-type transistor N10 are both connected to the first control circuit 1012 and the second control circuit 1013 (specifically, the second electrode of the fifth N-type transistor N5 and the first electrode of the fourth P-type crystal P4). A first electrode of the tenth N-type transistor N10 is connected to the input terminal to receive the input signal INPUT. The fourth control circuit 1016 provides a feedback mechanism for the input circuit 101 to enable it to operate with higher stability.

Figure 7:
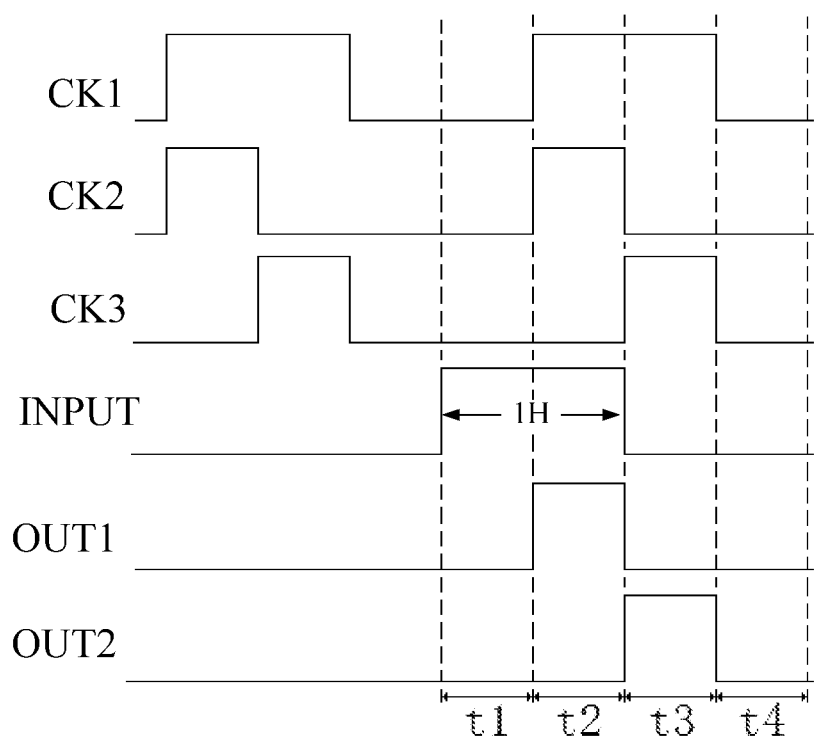
FIG. 7 is an exemplary timing diagram of the shift register unit shown in FIG. 6.

FIG. 7 is an exemplary timing diagram of the shift register unit circuit shown in FIG. 6. The operation of this circuit will now be described with reference to FIGS. 6 and 7.

The input signal INPUT is a pulse signal having an active interval 1 H (a high-level interval in the example of FIG. 7) defined by a leading edge and a trailing edge. The first clock signal CK1 has a period of 2 H and a duty ratio of 50%. Specifically, the first clock signal CK1 includes leading edges where the first clock signal CK1 transitions from inactive (low in the example of FIG. 7) to active (high in the example of FIG. 7) and trailing edges where the first clock signal CK1 transitions from active to inactive, with one of the leading edges being delayed by 1/2 H with respect to the leading edge of the input pulse INPUT. The second clock signal CK2 has a period of 2 H and a duty ratio of 25%. Specifically, the second clock signal CK2 includes leading edges where the second clock signal CK2 transitions from inactive to active and trailing edges where the second clock signal CK2 transitions from active to inactive, with the leading edges being synchronized with the leading edges of the first clock signal CK1. The third clock signal CK3 is a delayed version of the second clock signal CK2 delayed by 1/2 H.

In phase t1, the input signal INPUT is at a high level, and the first clock signal CK1, the second clock signal CK2, and the third clock signal CK3 are all at a low level.

Due to the high level of the input signal INPUT, both the third N-type transistor N3 and the fourth N-type transistor N4 are turned on. Since the third N-type transistor N3 is turned on, the control electrodes of the fifth N-type transistor N5 and the sixth N-type transistor N6 are all pulled to the second power supply voltage VSS (i.e., a low level). Therefore, the fifth N-type transistor N5 and the sixth N-type transistor N6 are both turned off. The fourth N-type transistor N4 is connected to be a diode so that the high level of the input signal INPUT is transferred to the control electrodes of the fourth P-type transistor P4 and the seventh N-type transistor N7, in which case the fourth P-type transistor P4 is turned off and the N-type transistor N7 is turned on. Since the first clock signal CK1 is at a low level, the control electrodes of the fifth P-type transistor P5 and the eighth N-type transistor N8 are all pulled down to the low level of the first clock signal CK1, in which case an inverter formed by the fifth P-type transistor P5 and the eighth N-type transistor N8 outputs a high level signal. Therefore, the control electrodes of the sixth P-type transistor P6 and the ninth N-type transistor N9 are all at a high level. At this time, an inverter formed by the sixth P-type transistor P6 and the ninth N-type transistor N9 outputs a low-level signal (i.e., the pre-output signal pOUT is at a low level in this phase). In response to the low level of the pre-output signal pOUT, the third inverter M3 outputs a high-level signal. Since both of the second clock signal CK2 and the third clock signal CK3 are at a low level, the first N-type transistor N1 and the second N-type transistor N2 are both turned off, and both the first P-type transistor P1 and the second P-type transistor P2 are turned on. The high-level first power supply voltage VDD is transferred to the first inverter M1 through the first P-type transistor P1 such that the first output signal OUT1 output from the first inverter M1 is at a low level. The high-level first power supply voltage VDD is transferred to the second inverter M2 through the second P-type transistor P2 such that the second output signal OUT2 output from the second inverter M2 is at a low level. That is, the first output signal OUT1 and the second output signal OUT2 are all at low level in phase t1.

In phase t2, the first clock signal CK1 is at a high level, the second clock signal CK2 is at a high level, the third clock signal CK3 is at a low level, and the input signal INPUT is at a high level.

Due to the high level of the input signal INPUT, both the third N-type transistor N3 and the fourth N-type transistor N4 are turned on. Since the third N-type transistor N3 is turned on, the control electrodes of the fifth N-type transistor N5 and the sixth N-type transistor N6 are all pulled to the second power supply voltage VSS (i.e., a low level). Therefore, the fifth N-type transistor N5 and the sixth N-type transistor N6 are both turned off. The fourth N-type transistor N4 is connected to be a diode so that the high level of the input signal INPUT is transferred to the gates of the fourth P-type transistor P4 and the seventh N-type transistor N7, in which case the fourth P-type transistor P4 is turned off and the seventh N-type transistor N7 is turned on. The control electrodes of the fifth P-type transistor P5 and the eighth N-type transistor N8 each receive the high level of the first clock signal CK1, in which case the inverter formed by the fifth P-type transistor P5 and the eighth N-type transistor N8 outputs a low level signal. Therefore, the control electrodes of the sixth P-type transistor P6 and the ninth N-type transistor N9 are all at a low level, in which case the inverter formed by the sixth P-type transistor P6 and the ninth N-type transistor N9 outputs a high-level signal (i.e., the pre-output signal pOUT is high in this phase). In response to the high level of the pre-output signal pOUT, the third inverter M3 outputs a low-level signal. Since the second clock signal CK2 is at a high level, the first N-type transistor N1 is turned on and the first P-type transistor P1 is turned off. The low-level signal output from the third inverter M3 is transferred to the first inverter M1 through the first N-type transistor N1 so that the first output signal OUT1 output from the first inverter M1 is at a high level. Since the third clock signal CK3 is still low, the second N-type transistor N2 is turned off and the second P-type transistor P2 is turned on. The high-level first power supply voltage VDD is transferred to the second inverter M2 through the second P-type transistor P2 such that the second output signal OUT2 output from the second inverter M2 is still at a low level.

In phase t3, the first clock signal CK1 is at a high level, the second clock signal CK2 is at a low level, the third clock signal CK3 is at a high level, and the input signal INPUT is at a low level.

Due to the low level of the input signal INPUT, the third N-type transistor N3 and the fourth N-type transistor N4 are both turned off, and the third P-type transistor P3 is turned on. Since the third N-type transistor N3 and the fourth N-type transistor N4 are both turned off, the other transistors in the input circuit 101 remain in the state of phase t2. The control electrodes of the sixth P-type transistor P6 and the ninth N-type transistor N9 connected to the second electrode of the third P-type transistor P3 are both at a low level, and the inverter formed by the sixth P-type transistor P6 and the ninth N-type transistor N9 outputs a high level signal (i.e., the pre-output signal pOUT is high in this phase). In response to the high level of the pre-output signal pOUT, the third inverter M3 outputs a low-level signal. Since the second clock signal CK2 is low, the first N-type transistor N1 is turned off and the first P-type transistor P1 is turned on. The high-level first power supply voltage VDD is transferred to the first inverter M1 through the first P-type transistor P1 such that the first output signal OUT1 output from the first inverter M1 is at a low level. Since the third clock signal CK3 is at a high level, the second N-type transistor N2 is turned on and the second P-type transistor P2 is turned off. The low-level signal output from the third inverter M3 is transferred to the second inverter M2 through the second N-type transistor N2 such that the second output signal OUT2 output from the second inverter M2 is at a high level.

In phase t4, the first clock signal CK1, the second clock signal CK2, and the third clock signal CK3 are all at a low level, and the input signal INPUT is at a low level.

Due to the low level of the input signal INPUT, the third N-type transistor N3 and the fourth N-type transistor N4 are both turned off, and the third P-type transistor P3 is turned on. Since the third N-type transistor N3 and the fourth N-type transistor N4 are both turned off, the other transistors in the input circuit 101 remain in the state of phase t2. The first clock signal CK1 is at a low level, so the control electrodes of the fifth P-type transistor P5 and the eighth N-type transistor N8 are all pulled down to the low level of the first clock signal CK1, in which case the inverter formed by the fifth P-type transistor P5 and the eighth N-type transistor N8 outputs a high-level signal. Therefore, the control electrodes of the sixth P-type transistor P6 and the ninth N-type transistor N9 are all at a high level, and the inverter formed by the sixth P-type transistor P6 and the ninth N-type transistor N9 outputs a low-level signal (i.e., the pre-output signal pOUT is low in this phase). In response to the low level of the pre-output signal pOUT, the third inverter M3 outputs a high-level signal. Since both of the second clock signal CK2 and the third clock signal CK3 are at a low level, the first N-type transistor N1 and the second N-type transistor N2 are both turned off, and both the first P-type transistor P1 and the second P-type transistor P2 are turned on. The high-level first power supply voltage VDD is transferred to the first inverter M1 through the first P-type transistor P1 such that the first output signal OUT1 output from the first inverter M1 is at a low level. The high-level first power supply voltage VDD is transferred to the second inverter M2 through the second P-type transistor P2 such that the second output signal OUT2 output from the second inverter M2 is at a low level. That is, both the first output signal OUT1 and the second output signal OUT2 are at a low level.

After phase t4, the first output signal OUT1 and the second output signal OUT2 remain at a low level. Upon the incoming of the high-level pulse of the next input signal INPUT, the shift register unit starts the operation of the next cycle.

It will be understood that in the embodiments described above, the "control gate" refers to the gate or base of the transistor, the "first electrode" refers to the source or emitter of the transistor and the "second electrode" refers to the drain or collector of the transistor. It will also be understood that the transistors are generally made symmetrical so that their "first electrode" and "second electrode" can be used interchangeably. Without loss of generality, N-type and P-type are also referred to herein as a first channel type and a second channel type, respectively. However, depending on whether the desired output signal is active high or active low, in the above embodiments, the N-type transistor may be replaced by a P-type transistor, and the P-type transistor by an N-type transistor. That is, the first channel type may refer to P-type, and the second channel type refers to N-type accordingly. In this case, the first power supply voltage VDD and the second power supply voltage VSS have a low level and a high level, respectively, and the first, second, and third clock signals CK1, CK2, and CK3 are inverted.

Figure 8:
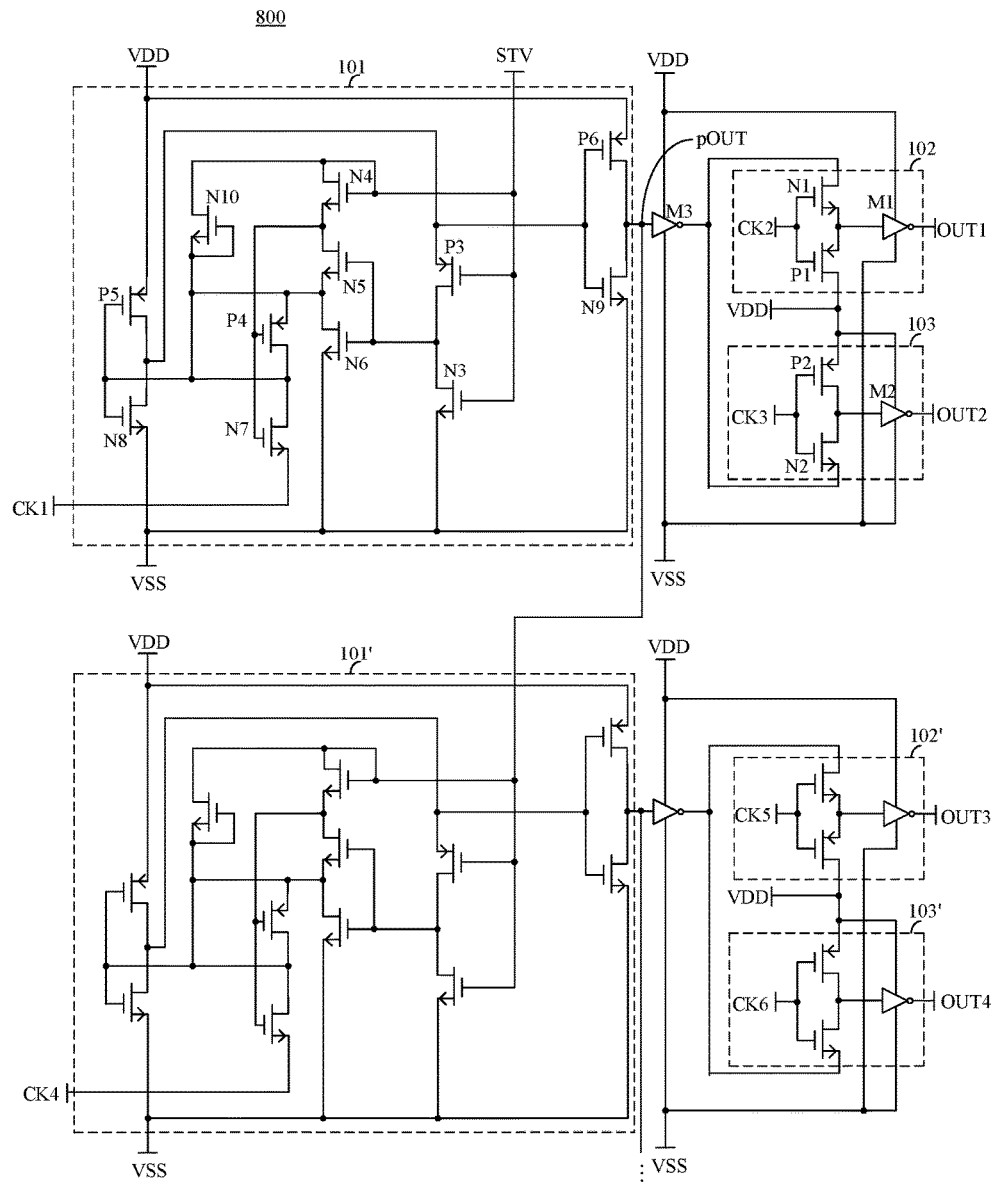
FIG. 8 is a partial circuit diagram of a gate driving circuit according to an embodiment of the present disclosure.

FIG. 8 is a partial circuit diagram of a gate driving circuit 800 according to an embodiment of the present disclosure.

The gate driving circuit 800 includes N cascaded shift register units (N is a positive integer and N≥2), each of which takes the form of the shift register unit 100 described in the above embodiments. The input terminal of an n-th one of the shift register units is connected to the pre-output terminal of an (n−1)-th one of the shift register units (n is a positive integer and 1<n≤N). Referring to FIG. 8, the first two shift register units included in the gate driving circuit 800 are shown, wherein the first shift register unit includes an input circuit 101, a first output circuit 102, and a second output circuit 103, and the second shift register unit includes an input circuit 101', a first output circuit 102', and a second output circuit 103'. The input terminal of the first shift register unit receives an input signal STV, and the pre-output terminal of the first shift register unit is connected to the input terminal of the second shift register unit, to output the pre-output signal pOUT to the second shift register unit as an input signal.

The first clock terminal, the second clock terminal and the third clock terminal of a (2k−1)-th one of the shift register units are configured to respectively receive the first clock signal, the second clock signal and the third clock signal (k is a positive integer and 1<2k≤N). Referring to FIG. 8, the first clock terminal, the second clock terminal, and the third clock terminal of the first shift register unit respectively receive the first clock signal CK1, the second clock signal CK2, and the third clock signal CK3. Under the control of the input signal STV, the first clock signal CK1, the second clock signal CK2, and the third clock signal CK3, the first shift register unit outputs the first output signal OUT1 and the second output signal OUT2.

The first clock terminal, the second clock terminal and the third clock terminal of a 2k-th one of the shift register units are configured to respectively receive a fourth clock signal, a fifth clock signal and a sixth clock signal. Referring to FIG. 8, the first clock terminal, the second clock terminal, and the third clock terminal of the second shift register unit respectively receive a fourth clock signal CK4, a fifth clock signal CK5, and a sixth clock signal CK6. Under the control of the input signal, the fourth clock signal CK4, the fifth clock signal CK5, and the sixth clock signal CK6, the second register unit outputs the third output signal OUT3 and the fourth output signal OUT4.

Figure 9:
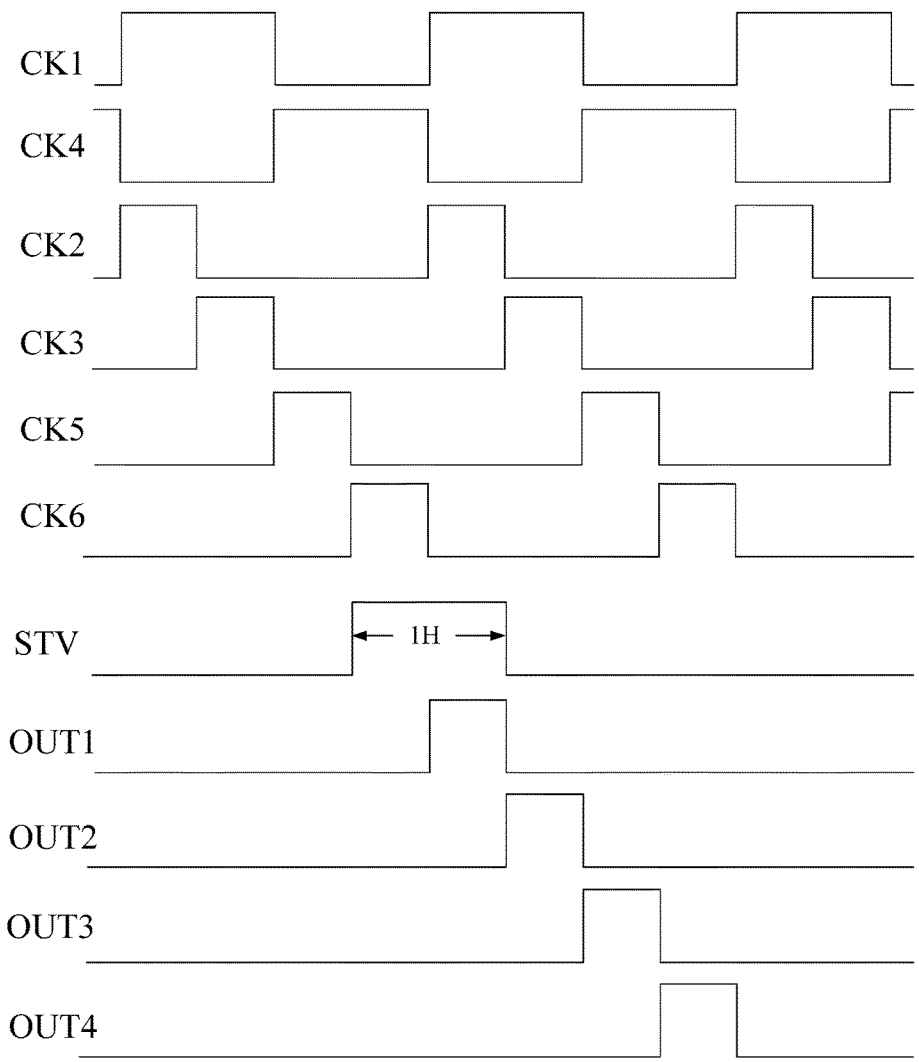
FIG. 9 is an exemplary timing diagram of the gate driving circuit shown in FIG. 8.

FIG. 9 is an exemplary timing diagram of the gate driving circuit 800 shown in FIG. 8.

The input signal STV, the first clock signal CK1, the second clock signal CK2, and the third clock signal CK3 are the same as those shown in FIG. 7. The fourth clock signal CK4 is an inverted version of the first clock signal CK1, the fifth clock signal CK5 is a delayed version of the third clock signal CK3 delayed by 1/2 H, and the sixth The clock signal CK6 is a delayed version of the fifth clock signal CK5 delayed by 1/2 H. As shown in FIG. 9, the active intervals of the first, second, third, and fourth output signals OUT1, OUT2, OUT3, and OUT4 are sequentially delayed by 1/2 H with respect to each other. Although only four output signals of the gate driving circuit 800 are shown in FIG. 9, it will be understood that more output signals may be generated depending on the number of shift register units included in the gate driving circuit 800.

Since a single shift register unit can output two gate driving signals, the number of shift register units in the gate driving circuit 800 can be reduced by half. This helps reduce power consumption, reduce circuit footprint, and save costs.

Figure 10:
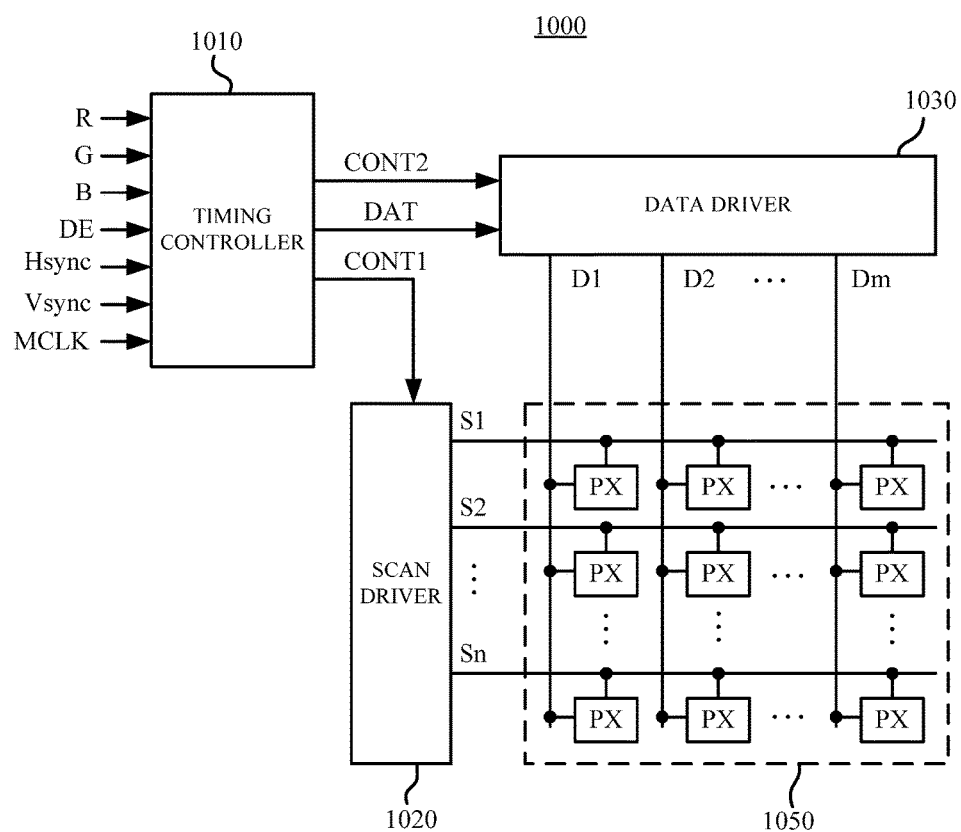
FIG. 10 is a block diagram of a display device according to an embodiment of the present disclosure.

FIG. 10 is a block diagram of a display apparatus 1000 according to an embodiment of the present disclosure. Referring to FIG. 10, the display device 1000 includes a timing controller 1010, a scan driver 1020, a data driver 1030, and an array substrate 1050.

The array substrate 1050 includes a plurality of pixels PX arranged substantially in a matrix. In the array substrate 1050, a plurality of substantially parallel scan lines S1 to Sn extend in the row direction, and a plurality of substantially parallel data lines D1 to Dm extend in the column direction. The scan lines S1 to Sn and the data lines D1 to Dm are coupled to the pixels PX.

The timing controller 1010 receives synchronization signals and video signals R, G, and B from the system interface. The synchronization signals include a horizontal synchronization signal Hsync, a vertical synchronization signal Vsync, a master clock signal MCLK, and a data enable signal DE. The video signals R, G, and B contain luminance information for each of a plurality of pixels PX. The timing controller 1010 generates a first driving control signal CONT1, a second driving control signal CONT2, and an image data signal DAT based on the video signals R, G, and B, the horizontal synchronization signal Hsync, the vertical synchronization signal Vsync, the data enable signal DE, and the master clock signal MCLK. The first driving control signal CONT1 includes a frame start signal STV, a first clock signal CLK1, a second clock signal CLK2, a third clock signal CLK3, a fourth clock signal CLK4, a fifth clock signal CLK5, and a sixth clock signal CLK6. The frame start signal STV is a signal for generating a first scan signal for displaying a single frame image. The clock signals CLK1, CLK2, CLK3, CLK4, CLK5, and CLK6 are synchronization signals for sequentially generating the scan signals that are to be applied to the corresponding scan lines S1-Sn. The timing controller 1010 transmits the image data signal DAT and the second drive control signal CONT2 to the data driver 1030.

The scan driver 1020 is coupled to the scan lines S1-Sn and generates a corresponding plurality of scan signals based on the first drive control signal CONT1. The scan driver 1020 may sequentially apply the scan signals to the scan lines S1-Sn. The scan driver 1020 may take the form of the gate driving circuit 800 described in the above embodiments.

The data driver 1030 is coupled to the data lines D1-Dm, samples and holds the image data signal DAT based on the second driving control signal CONT2, and applies a plurality of data signals to the data lines D1 to Dm, respectively. By applying the data signals having set voltage ranges to the data lines D1 to Dm based on the scan signals output from the scan driver 1020, the data driver 1030 can program data to the pixels PX.

Examples of the display device 1000 include a liquid crystal display, an organic light emitting diode display, or any other suitable display. Specifically, the display device 1000 may be any product or component that has a display function, such as an electronic paper, a mobile phone, a tablet computer, a television, a notebook computer, a digital photo frame, a navigator, and the like.

It will be understood that the discussion of any of the above embodiments is merely exemplary and is not intended to limit the scope of the present disclosure. The above embodiments or the technical features in different embodiments may be combined. The steps in the method can be implemented in a different order than shown. To simplify the illustration, well-known power/ground connections to the circuits may or may not be shown in the figures. In addition, the details of the devices shown in block diagram form are highly dependent on the platform on which the present disclosure is to be implemented. Therefore, these descriptions should be considered as illustrative and not restrictive.

Although the present disclosure has been described in conjunction with specific embodiments thereof, many alternatives, modifications, and variations of these embodiments will be apparent to those of ordinary skill in the art. All such alternatives, modifications, and variations fall within the scope of the disclosure.

What is claimed is:

1. A shift register unit comprising:
    an input terminal for receiving an input signal;
    a first clock terminal for receiving a first clock signal;
    a second clock terminal for receiving a second clock signal;
    a third clock terminal for receiving a third clock signal;
    a pre-output terminal for outputting a pre-output signal;
    a first output terminal for outputting a first output signal;
    a second output terminal for outputting a second output signal;
    an input circuit configured to output the pre-output signal via the pre-output terminal in response to the input signal and the first clock signal;
    a first output circuit, connected to the input circuit, configured to output the first output signal via the first output terminal in response to the pre-output signal and the second clock signal; and
    a second output circuit, coupled to the input circuit, configured to output the second output signal via the second output terminal in response to the pre-output signal and the third clock signal,
    wherein the first and second output circuits comprise at least one configuration selected from a group consisting of:
    (i) the first output circuit comprising: a first transistor of a first channel type having a control electrode connected to the second clock terminal, a first electrode connected to the pre-output terminal, and a second electrode connected to the first output terminal; and a first transistor of a second channel type having a control electrode connected to the second clock terminal, a first electrode configured to receive a first power supply voltage, and a second electrode connected to the first output terminal, and
    (ii) the second output circuit comprising: a second transistor of a first channel type having a control electrode connected to the third clock terminal, a first electrode connected to the second output terminal, and a second electrode connected to the pre-output terminal; and a second transistor of a second channel type having a control electrode connected to the third clock terminal, a first electrode connected to the second output terminal, and a second electrode configured to receive a first power supply voltage.

2. The shift register unit of claim 1, further comprising:
    a third inverter connected between the pre-output terminal and the first and second output circuits;
    a first inverter connected between the first output circuit and the first output terminal; and
    a second inverter connected between the second output circuit and the second output terminal.

3. The shift register unit of claim 1, wherein the input circuit comprises:
    an input sub-circuit, connected to the input terminal, configured to output a first control signal and a second control signal in response to the input signal;
    a first control circuit, connected to the input sub-circuit, configured to output a third control signal in response to the first control signal;
    a second control circuit, connected to the input sub-circuit and the first clock terminal, configured to output a fourth control signal in response to the second control signal;
    a third control circuit, connected to the first control circuit and the second control circuit, configured to output a fifth control signal in response to the third control signal and the fourth control signal; and
    a pre-output circuit, connected to the third control circuit, configured to output the pre-output signal in response to the fifth control signal.

4. The shift register unit of claim 3, wherein the input sub-circuit comprises:
    a third transistor of a first channel type having a control electrode connected to the input terminal, a first electrode connected to the first control circuit, and a second electrode configured to receive a second power supply voltage;
    a third transistor of a second channel type having a control electrode connected to the input terminal, a first electrode connected to the first electrode of the third transistor of the first channel type, and a second electrode connected to the third control circuit; and
    a fourth transistor of the first channel type having a control electrode connected to the input terminal, a first electrode connected to the input terminal, and a second electrode connected to the second control circuit.

5. The shift register unit of claim 4, wherein the first control circuit comprises:
    a fifth transistor of the first channel type having a control electrode connected to the first electrode of the third transistor of the first channel type, a first electrode connected to the second electrode the fourth transistor of the first channel type, and a second electrode connected to the third control circuit; and a sixth transistor of the first channel type having a control electrode connected to the first electrode of the third transistor of the first channel type, a first electrode connected to the second electrode of the fifth transistor of the first channel, and a second electrode configured to receive the second power supply voltage.

6. The shift register unit of claim 5, wherein the second control circuit comprises:
a fourth transistor of the second channel type having a control electrode connected to the second electrode of the fourth transistor of the first channel type, a first electrode connected to the third control circuit, and a second electrode connected to the second electrode of the fifth transistor of the first channel type; and
a seventh transistor of the first channel type having a control electrode connected to the second electrode of the fourth transistor of the first channel type, a first electrode connected to the first electrode of the fourth transistor of the second channel type, and a second electrode connected to the first clock terminal.

7. The shift register unit of claim 6, wherein the third control circuit comprises:
a fifth transistor of the second channel type having a control electrode connected to the second electrode of the fifth transistor of the first channel type, a first electrode connected to the second electrode of the third transistor of the second channel type, and a second electrode configured to receive a first power supply voltage; and
an eighth transistor of the first channel type having a control electrode connected to the second electrode of the fifth transistor of the first channel and the first electrode of the fourth transistor of the second channel type, a first electrode connected to the second electrode of the third transistor of the second channel type, and a second electrode configured to receive the second power supply voltage.

8. The shift register unit of claim 7, wherein the pre-output circuit comprises:
a sixth transistor of the second channel type having a control electrode connected to the first electrode of the fifth transistor of the second channel type and the first electrode of the eighth transistor of the first channel, a first electrode connected to the pre-output terminal, and a second electrode configured to receive the first power supply voltage; and
a ninth transistor of the first channel type having a control electrode connected to the first electrode of the fifth transistor of the second channel type, a first electrode connected to the pre-output terminal, and a second electrode configured to receive the second power supply voltage.

9. The shift register unit according to claim 8, wherein the input circuit further comprises a fourth control circuit connected to the input sub-circuit, the first control circuit and the second control circuit and configured to output a sixth control signal in response to the third control signal and the fourth control signal, and wherein the input sub-circuit is further configured to output the first control signal in response to the sixth control signal and the second control signal.

10. The shift register unit of claim 9, wherein the fourth control circuit comprises a tenth transistor of the first channel type having a control electrode connected to the second electrode of the fifth transistor of the first channel type and the first electrode of the fourth transistor of the second channel type, a first electrode connected to the input terminal, and a second electrode connected to the control electrode of the tenth transistor of the first channel type.

11. A gate driving circuit comprising N cascaded shift register units as claimed in claim 1, N being a positive integer and N≥2, wherein the input terminal of an n-th one of the shift register units is connected to the pre-output terminal of an (n−1)-th one of the shift register units, n being a positive integer and 1<n≤N.

12. The gate driving circuit of claim 11,
wherein the first clock terminal, the second clock terminal and the third clock terminal of a (2k−1)-th one of the shift register units are configured to respectively receive the first clock signal, the second clock signal and the third clock signal, k being a positive integer and 1<2k≤N, and
wherein the first clock terminal, the second clock terminal and the third clock terminal of a 2k-th one of the shift register units are configured to respectively receive a fourth clock signal, a fifth clock signal and a sixth clock signal.

13. The gate driving circuit of claim 12,
wherein the first clock signal has a period of 2 H and a duty cycle of 50%,
wherein the second clock signal has a period of 2 H and a duty cycle of 25%,
wherein the third clock signal is a delayed version of the second clock signal delayed by 1/2 H,
wherein the fourth clock signal is an inverted version of the first clock signal,
wherein the fifth clock signal is a delayed version of the third clock signal delayed by 1/2 H, and
wherein the sixth clock signal is a delayed version of the fifth clock signal delayed by 1/2 H.

14. An array substrate comprising the gate driving circuit of claim 11.

15. A display device comprising the gate driving circuit of claim 11.

16. A method of driving a shift register unit, wherein the shift register unit comprises:
an input terminal for receiving an input signal;
a first clock terminal for receiving a first clock signal;
a second clock terminal for receiving a second clock signal;
a third clock terminal for receiving a third clock signal;
a pre-output terminal for outputting a pre-output signal;
a first output terminal for outputting a first output signal;
a second output terminal for outputting a second output signal;
an input circuit configured to output the pre-output signal via the pre-output terminal in response to the input signal and the first clock signal;
a first output circuit, connected to the input circuit, configured to output the first output signal via the first output terminal in response to the pre-output signal and the second clock signal; and
a second output circuit, coupled to the input circuit, configured to output the second output signal via the second output terminal in response to the pre-output signal and the third clock signal,
the method comprising:
supplying a pulse signal to the input terminal as the input signal, the pulse signal having an active interval 1 H defined by a leading edge and a trailing edge;
supplying the first clock signal to the first clock terminal, the first clock signal having a period of 2 H and a duty cycle of 50%, the first clock signal comprising leading edges where the first clock signal transitions from inactive to active and trailing edges where the first clock signal transitions from active to inactive, one of the leading edges being delayed by 1/2 H with respect to the leading edge of the input pulse;

supplying the second clock signal to the second clock terminal, the second clock signal having a period of 2 H and a duty cycle of 25%, the second clock signal comprising leading edges where the second clock signal transitions from inactive to active and trailing edges where the second clock signal transitions from active to inactive, the leading edges being synchronized with the leading edges of the first clock signal; and supplying the third clock signal to the third clock terminal, the third clock signal being a delayed version of the second clock signal delayed by 1/2 H.

17. A shift register unit comprising:

an input terminal for receiving an input signal;

a first clock terminal for receiving a first clock signal;

a second clock terminal for receiving a second clock signal;

a third clock terminal for receiving a third clock signal;

a pre-output terminal for outputting a pre-output signal;

a first output terminal for outputting a first output signal;

a second output terminal for outputting a second output signal;

an input circuit configured to output the pre-output signal via the pre-output terminal in response to the input signal and the first clock signal;

a first output circuit, connected to the input circuit, configured to output the first output signal via the first output terminal in response to the pre-output signal and the second clock signal; and a second output circuit, coupled to the input circuit, configured to output the second output signal via the second output terminal in response to the pre-output signal and the third clock signal, wherein the input circuit comprises:

an input sub-circuit, connected to the input terminal, configured to output a first control signal and a second control signal in response to the input signal;

a first control circuit, connected to the input sub-circuit, configured to output a third control signal in response to the first control signal;

a second control circuit, connected to the input sub-circuit and the first clock terminal, configured to output a fourth control signal in response to the second control signal;

a third control circuit, connected to the first control circuit and the second control circuit, configured to output a fifth control signal in response to the third control signal and the fourth control signal; and a pre-output circuit, connected to the third control circuit, configured to output the pre-output signal in response to the fifth control signal.

* * * * *